US006998928B2

(12) United States Patent
Stengel et al.

(10) Patent No.: US 6,998,928 B2
(45) Date of Patent: Feb. 14, 2006

(54) DIGITAL PULSE WIDTH MODULATION

(75) Inventors: Robert E. Stengel, Pompano Beach, FL (US); Wen Yu, Sunrise, FL (US)

(73) Assignee: Motorola, Inc., Schaumburg, IL (US)

(*) Notice: Subject to any disclaimer, the term of this patent is extended or adjusted under 35 U.S.C. 154(b) by 237 days.

(21) Appl. No.: 10/430,099

(22) Filed: May 6, 2003

(65) Prior Publication Data
US 2004/0222866 A1 Nov. 11, 2004

(51) Int. Cl.
*H03K 7/08* (2006.01)

(52) U.S. Cl. .................. 332/109; 329/152; 329/172; 329/175; 347/9
(58) Field of Classification Search .............. 332/109; 327/152, 175, 172; 347/9
See application file for complete search history.

(56) References Cited

U.S. PATENT DOCUMENTS 6,439,679 B1 * 8/2002 Roylance ............... 347/9
6,798,258 B1 * 9/2004 Rieven .................. 327/152

OTHER PUBLICATIONS

"IEEE Standard Dictionary of Electrical and Electronics Terms" Third Edition Wiley–Interscience 1984.*
Dancy, Abram P., and Chandrakasan "Ultra Low Power Control Circuits for PWM Converters," Power Electronics Specialists Conference, IEEE 1997, vol. 1 pp. 21–27.
Hiorns, R. E., and Sandler "Power Digital to Analogue Conversion Using Pulse Width Modulation and Digital Signal Processing," IEEE Proceedings—G, vol. 140, No. 5, Oct. 1993.

* cited by examiner

*Primary Examiner*—Michael B Shingleton

(57) ABSTRACT

A digital technique for pulse width modulation (PWM) utilizes a tapped delay line 304 receiving a reference clock and generating a plurality of time delayed reference clock transitions having finer time resolution than the reference clock signal. A multiplexer 120 receives the plurality of time delayed reference clock transitions as an input thereto and producing an output when one of the plurality of time delayed reference clock transitions is addressed. An accumulator circuit 524 generates control timing signals associated with the input signal sampling rate $F_{sample}$ that are used to select outputs from the delay line 304 representing a pulse width modulated output signal.

31 Claims, 7 Drawing Sheets

DIGITAL PULSE WIDTH MODULATION

FIELD OF THE INVENTION

This invention relates generally to the field of pulse width modulation (PWM). More particularly, this invention relates to digital pulse width modulation.

BACKGROUND OF THE INVENTION

Pulse width modulation can be implemented in any one of four variations. In each case, an input signal is modulated in such a manner that the width of a pulse within a stream of pulses represents an amplitude of the input signal at a sampling time. In a first variation of PWM, the relative time of the rising edge of each pulse in the stream of pulses is fixed, and each pulse is varied in width by changing the timing of its falling edge. In a second variation of PWM, the relative time of the falling edge of each pulse in the stream of pulses is fixed, and each pulse is varied in width by changing the timing of its rising edge. In a third variation of PWM, the relative time of the center of each pulse in the stream of pulses is fixed, and each pulse is varied in width by changing the timing of both its rising and falling edge in a symmetrical manner. Finally, in a fourth variation of PWM, the relative time of the center of each pulse in the stream of pulses is fixed, and each pulse is varied in width by independently changing the timing of both its rising and falling edge. Each of these variations of PWM can be implemented either as class AD (a two state implementation) or as class BD (a three state implementation).

Generally speaking, most higher frequency PWM systems have been implemented using analog circuitry due to the high level of computational complexity in accurately processing the edges of the pulses in the pulse stream at high speeds. This is particularly true when both edges are varied as in the third and fourth variation, and is most difficult when both edges are varied independently. Moreover, the higher the frequency of processing required, the greater the current consumption that digital circuits use frequently dictating that analog PWM circuits be used, particularly in battery powered communication equipment.

Analog pulse width modulators generally create a stream of pulses by use of a comparator that compares an input signal with a periodic sawtooth or triangular waveform, thus producing a stream of pulses whose accuracy depends upon the accuracy and reproducibility of the sawtooth or triangular waveform. It would be desirable to have a Pulse Width Modulator with certain improved capabilities.

BRIEF DESCRIPTION OF THE DRAWINGS

The features of the invention believed to be novel are set forth with particularity in the appended, claims. The invention itself however, both as to organization and method of operation, together with objects and advantages thereof, may be best understood by reference to the following detailed description of the invention, which describes certain exemplary embodiments of the invention, taken in conjunction with the accompanying drawings in which:

DETAILED DESCRIPTION OF THE INVENTION

Figure 1:
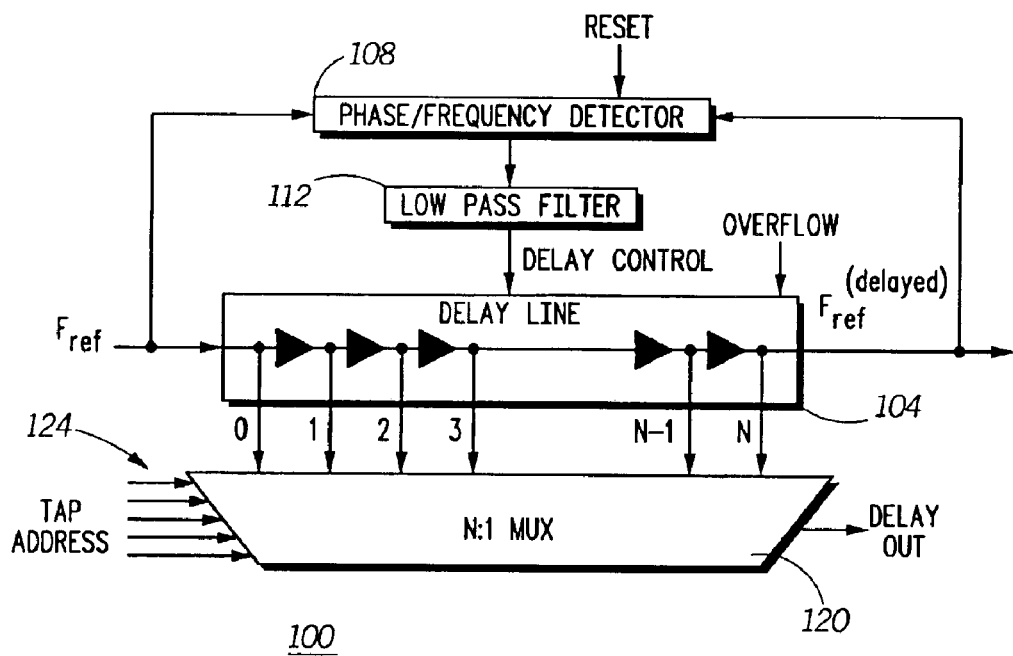
FIG. 1 is a diagram of a locked delay line and multiplexer arrangement consistent with certain embodiments of the present invention.

While this invention is susceptible of embodiment in many different forms, there is shown in the drawings and will herein be described in detail specific embodiments, with the understanding that the present disclosure is to be considered as an example of the principles of the invention and not intended to limit the invention to the specific embodiments shown and described. In the description below, like reference numerals are used to describe the same, similar or corresponding elements in the several views of the drawings.

The terms "a" or "an", as used herein, are defined as one or more than one. The term "plurality", as used herein, is defined as two or more than two. The term "another", as used herein, is defined as at least a second or more. The terms "including" and/or "having", as used herein, are defined as comprising (i.e., open language). The term "coupled", as used herein, is defined as connected, although not necessarily directly, and not necessarily mechanically. The term "program", as used herein, is defined as a sequence of instructions designed for execution on a computer system. A "program", or "computer program", may include a subroutine, a function, a procedure, an object method, an object implementation, in an executable application, an applet, a servlet, a source code, an object code, a shared library/dynamic load library and/or other sequence of instructions designed for execution on a computer system.

There are often many advantages in the use of digital signal processing in place of traditionally analog functions. Some of the benefits that are often achieved include, but are not limited to, automated integrated digital circuit design and hardware implementation, with an associated rapid increase in functionality as technology progresses with the passing of time. Digital communications has become the standard expectation with existing analog systems remaining flat in growth or disappearing altogether. Unfortunately, PWM has failed to keep pace with many other technologies in conversion from analog to digital. Time resolution requirements needed to achieve high signal to noise ratio (SNR) (e.g., a 90 dB SNR audio power amplifier specification) have slowed the progress of digital PWM (DPWM) applications in demanding applications such as audio amplifiers. It has been demonstrated that counter implementations benefit from over sampling, noise shaping, and pre-compensation to achieve high SNR performance. Implementations combining a delay line with a counter have been shown to increase the PWM time step resolution for the lower performance requirements of DC-to-DC converter applications, but have not been applied to achieve control of rising and/or falling edges of a PWM signal in order to achieve the accuracy necessary to achieve a high (e.g., 90 dB) SNR in demanding applications such as high fidelity audio. Certain embodiments of a PWM consistent with the present invention utilizes a delay line in conjunction with circuitry suitable to realize such high signal to noise ratios.

Turning now to FIG. 1, a delay line and multiplexer (MUX) network suitable for use in conjunction with the present DPWM circuit is illustrated as 100. In this exemplary circuit, an N stage delay line 104 receives a reference input clock signal $F_{REF}$ which passes through each stage of the delay line to produce one of N delayed versions of $F_{REF}$ until finally emerging by a specified delay amount at the output. If the N delay elements are selected to equal one reference clock period, the output signal delayed by N delay elements represents $F_{REF}$ delayed by one cycle. At each of N delayed output taps of the delay line 104, a progressively delayed version of the input clock $F_{REF}$ is available. The exact amount of delay available at each of the N delay elements can be varied and thereby locked by a separate delay control input to the delay line.

By comparing the phase of $F_{REF}(N)$ (the output at the Nth tap) with the phase of $F_{REF}(0)$ (the input of the first delay element—tap 0) at phase/frequency detector 108, and low pass filtering its output at low pass filter 112, a delay control signal can be produced in a known manner to produce a delay locked loop structure that locks the delay line 104 to the reference clock. An N:1 multiplexer 120 can then be used to select any one of the delayed or un-delayed clock signals present at outputs 0-N of the delay line by appropriately addressing the multiplexer 120 with tap address lines 124 of the MUX 120. This produces the desired delayed version of $F_{REF}$ exhibiting one of N possible delays at the multiplexer output. The resolution of $F_{REF}$ is thus multiplied by a factor of N, and the delayed $F_{REF}$ emerges at the Delay Out output. Thus, by use of a locked delay line as depicted in FIG. 1, the resolution of a fixed frequency input can be used to increase the available resolution for rising and/or falling edge precision in a digital PWM circuit, as will become clear upon study of the discussion to follow.

Figure 2:
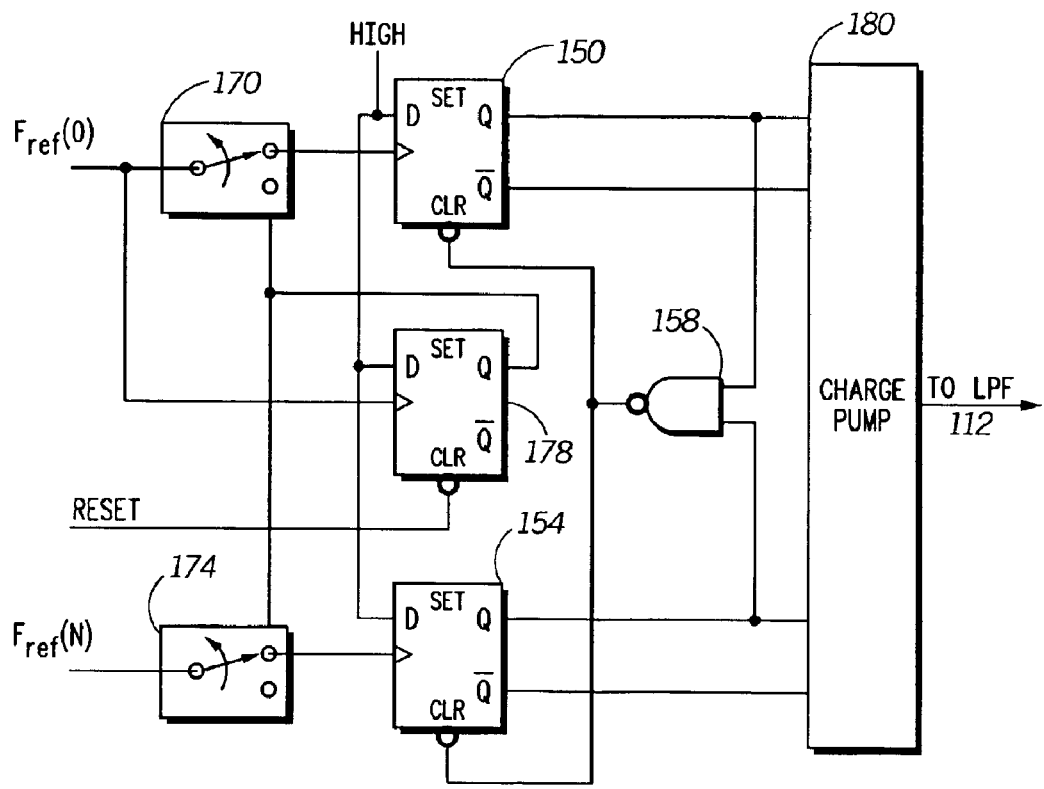
FIG. 2 is a diagram of a phase frequency detector with wave length control logic consistent with certain embodiments of the present invention.

Existing phase frequency detectors used in phase locked loop systems are not sensitive to additional wavelength phase offset between the two input signals. The circuit of FIG. 2 is a phase/frequency detector (made up of D flip flops 150, 154, and 178), consistent with certain embodiments of the invention, having wavelength control logic 170, 174, and 158. Input signals $F_{REF}(0)$ and $F_{REF}(N)$ (the outputs at taps 0 and N respectively) are coupled into the phase/frequency detector after the reset input is brought high and the $F_{REF}(0)$ signal goes from low to high by turning switches 170 and 174 on. Switches 170 and 174 can be implemented as transmission gates within CMOS integrated technology. The outputs of D flip flops 150 and 154 can be used to drive a charge pump circuit 180, with one or more of the outputs of 150 controlling pumping up of the charge pump and one or more of the outputs of 154 controlling the pumping down of the charge pump 180. The output of charge pump 180 can then drive the low pass filter (e.g., low pass filter 112) in the delay locked loop.

Figure 3:
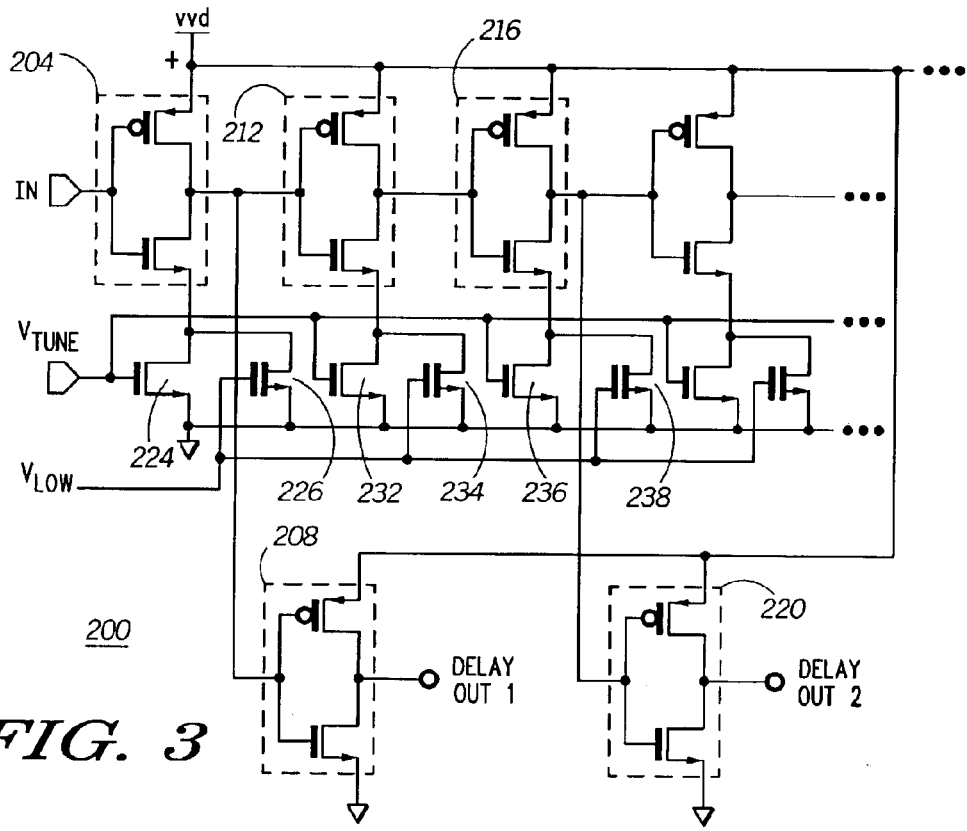
FIG. 3 is a unit delay circuit consistent with certain embodiments of a delay line as used in the present invention.

One example of a digital time delay element that can be used to fabricate delay line 104 is two sets of series connected MOS inverters with adjustable current sources to control the delay as depicted in multiple instances in circuit 200 of FIG. 3. The delay time is produced by a delay in the falling and rising inverter transitions. This can be modeled as a discharge or charging RC function, where R is dominated by the drain source resistance $R_{ds(on)}$, and C is the gate source capacitance $C_{gs}$, of the complementary inverter pair. An additional series device in the supply or ground terminal 224, 232, 236, 226, 234, and 238, of the inverter serves as a delay control, by limiting the available charge or discharge current so that the transition delay can be tuned. In this exemplary embodiment of a delay line, a pair of inverters 204 and 208 connected in series forms a buffer that has two inverter delays to produce a controlled delayed output at the first delay output. Inverter 208 is available to drive the load external to the delay line without additional loading. A second equal delay is made up of two buffers. The two buffers are made up of four inverters—204, 212, 216 and 220. This pattern is extended as long as required to generate the N buffer delays. Each current source has an associated transistor acting as a current source, i.e., 224, 232, and 236 that are controlled by a gate drive signal ($V_{tune}$) to determine the amount of charge and discharge current available to each inverter and thus the delay associated with each inverter. A second set of control current source transistors in parallel 226, 234 and 238 are used to set the lowest delay line speed above two wavelengths using input voltage $V_{low}$. The circuit shown in FIG. 2 provides a method of controlling the flow on delayed signals $F_{REF}(0)$ and $F_{REF}(N)$ to insure a single wavelength of delay between them.

Using standard techniques, each of the series connected digital delay buffers is designed to have identical delay time $t_d$. Where $t_d*N$ is equal to an integer cycle delay (e.g., one) of the input reference signal $F_{REF}$. This wavelength delay line delay can be locked with the use of phase/frequency detector 108 and low pass filter 112 in a feedback loop to the digital buffer delay control terminal as depicted in FIG. 1. A reduced power delay lock loop can be used to save the delay control signal analog amplitude value for application to the delay line control input with the phase frequency detector and low pass filter decoupled from the feedback loop. This allows the delay line input signal to be removed until a delayed output signal is needed, reducing the total power dissipation by a factor of $F_{REF}/(2*F_{sample})$.

Figure 4:
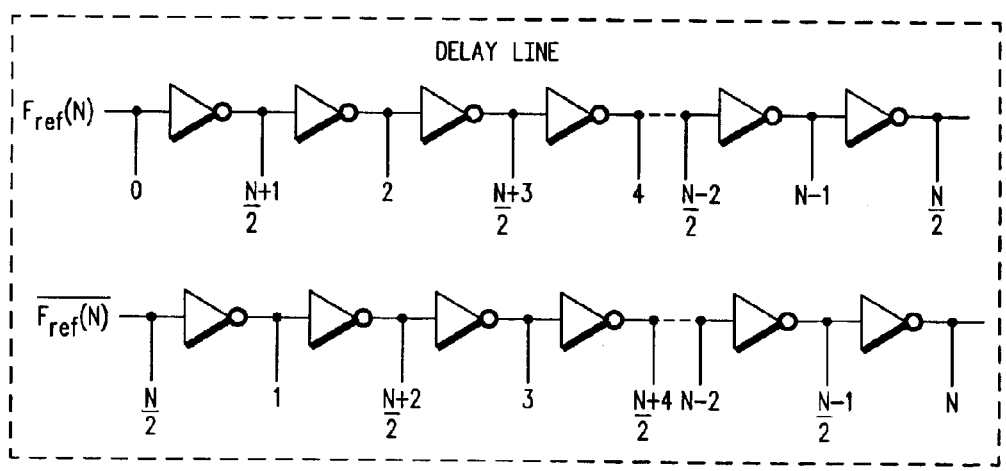
FIG. 4 is a delay line network made up of unit delay circuits consistent with certain embodiments of a delay locked loop in the present invention.

Those skilled in the art will appreciate that simplification of the delay elements to a single inverter is possible with equal charging ($t_r$) and discharging ($t_r$) delay times. The delay line then becomes two sets of N/2 inverters driven with complementary $F_{REF}$ signals, as shown in FIG. 4. The total delay for each of these complementary delay line pair is half the cycle time of the input signal $F_{REF}$. One advantage of this delay line architecture is an increase in the time resolution for a given integrated circuit technology by a factor of two over a delay line made of buffers rather than inverters, while decreasing the composite differential delay line current by a factor of four. A second advantage of the architecture of the delay line of FIG. 4 is an increase in the signal to noise ratio by a factor of eight. This is a result of the number of series inverters decreasing by a factor of four (sixteen in two lines vs. 64 in one line for a 32 element delay line) and differential output providing a factor of two improvement over single ended. Other delay line variations can also be used without departing from the present invention.

Figure 5:
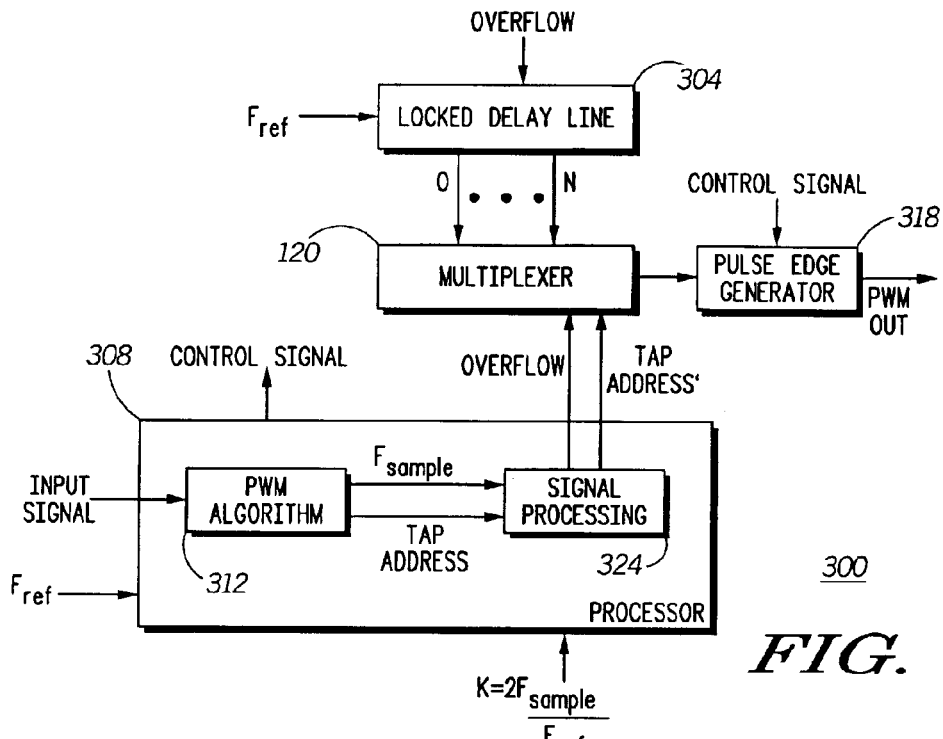
FIG. 5 is a DPWM circuit consistent with certain embodiments of the present invention.

The delay line structure and multiplexer network 100 depicted in FIG. 1 can be advantageously employed in implementing a DPWM circuit 300 as depicted in FIG. 5. A locked delay line similar to elements 104, 108 and 112 is depicted as 304. In one embodiment, delay line 304 is a delay line with a control signal to insure a single wave length delay between tap 0 and N. The 0-N delay line outputs are provided to a multiplexer 120 as in circuit 100. In order to created a DPWM circuit, a digitized input stream is provided as an input signal to a signal processor 308 in this circuit. This signal processor 308 is clocked at the delay line input rate $F_{REF}$. Input value k is a function of $F_{sample}$ the input signal sampling rate and $F_{REF}$. Signal processor 308 may be implemented using a programmed digital computer or a digital signal processor or using discrete logic functional blocks as will be described in a more detailed embodiment to follow. In any case, the input signal is processed by a PWM algorithm at 312. PWM algorithm 312 receives the sequence of digitized input values and directly or indirectly computes a pulse width and/or associated edge transition times therefrom. Transition times are represented by a tap address that can be supplied to the multiplexer 120 and is clocked out to a pulse edge generating circuit 318. Pulse edge generating circuit 318 generates rising and/or falling edges of a pulse representing the sample of the input signal at hand to produce a pulse width modulated signal output.

Thus, in certain embodiments, a pulse width modulator consistent with the present invention has a reference clock and a tapped delay line receiving the reference clock $F_{REF}$ and generating a plurality of time delayed reference clock transitions having finer time resolution than the reference clock signal. A multiplexer receives the plurality of time delayed reference clock transitions as an input thereto and producing an output when one of the plurality of time delayed reference clock transitions is addressed. A signal processor receives a sampled input signal, calculates a delay line tap address associated with a rising edge time of the sampled input signal, addresses the delay line tap address associated with the rising edge to produce a rising edge time, calculates a delay line tap address associated with a falling edge time of the sampled input signal, and addresses the delay line tap address associated with the falling edge to produce a falling edge time. A pulse edge generator generates a rising edge of an output pulse at the rising edge time and generates a falling edge of an output pulse at the falling edge time. Many variations will occur to those skilled in the art upon consideration of the present teaching.

Signal processor 308 may also incorporate a signal processing function 324 that (either before, during or after the PWM algorithm) carries out any desired signal processing on the digitized input signal or the tap addresses. For example, but not by way of any limitation, noise shaping, dithering, filtering, predistortion, or other digital processing can be implemented using signal processing 324 to enhance signal to noise performance or produce other desired effects on the modulated output. The digital processing, however, is simplified in this exemplary embodiment to a process of generating a tap value for selection of a tap from the locked delay line 304 and production of a control signal and an overflow that determines when the tap value should be selected and transferred to the pulse edge generator. This process can thus be digitized to produce a digital PWM that can be implemented using relatively low reference frequencies compared with pulse width resolution apparent at the output of the pulse width modulator.

Figure 6:
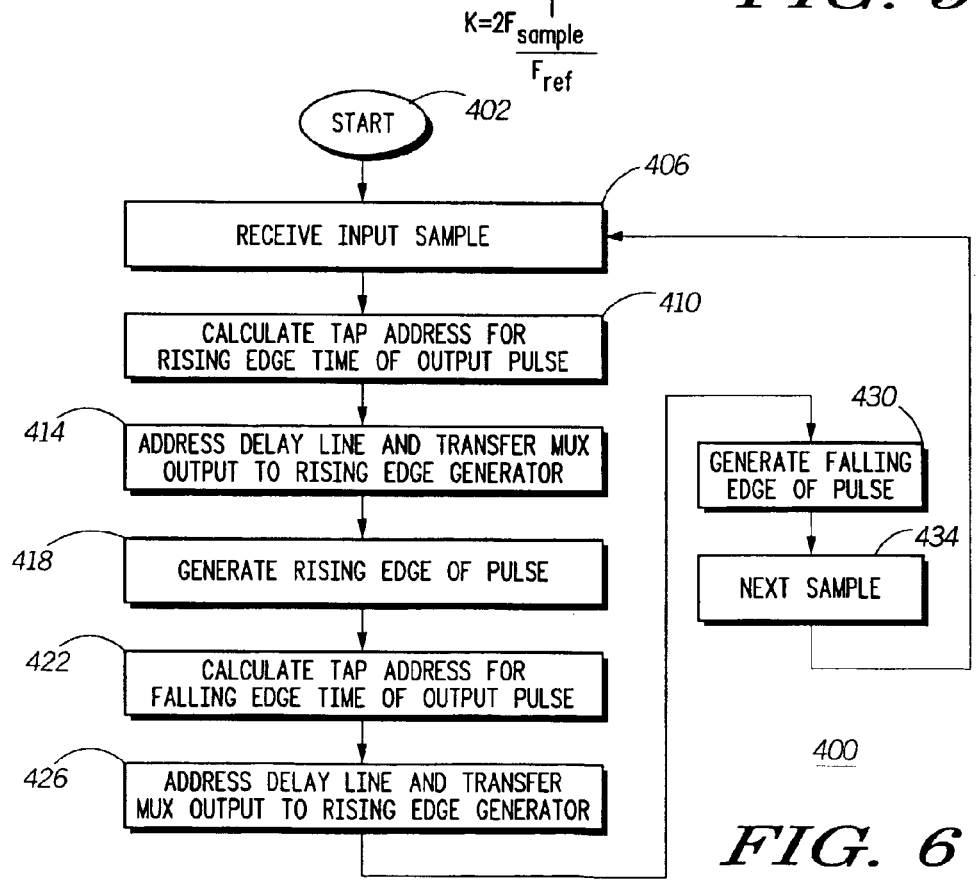
FIG. 6 is a flow chart depicting operation of a DPWM circuit consistent with certain embodiments of the present invention.

The operation of the DPWM circuit 300 as described above can be summarized in the flow chart 400 shown as FIG. 6 starting at 402. At 406 an input sample of a digitized signal to be modulated is received and at 410 a tap address for the rising edge of an output pulse is computed. Such computation may include signal processing such as filtering or dithering if desired. A delay line tap is then addressed at 414 and a delayed clock frequency is selected and transferred to the pulse edge generator to generate a rising edge of the PWM output pulse at 418. At 422 a tap address for the falling edge of an output pulse is computed. Such computation may include signal processing such as filtering or dithering if desired. The delay line tap is then addressed at 426 and a delayed clock frequency is selected and transferred to the pulse edge generator to generate a falling edge of the PWM output pulse at 430. The next sample is then selected at 434 for receipt and control returns to 406.

Thus, a method of generating a pulse width modulated signal from a sampled input signal consistent with certain embodiments of the invention involves applying a reference clock signal to a tapped delay line to generate a plurality of time delayed reference clock transitions having finer time resolution than the reference clock signal; calculating a delay line tap address associated with an edge time of the sampled input signal; addressing the delay line tap address associated with the edge time to produce a pulse edge at the edge time; and generating a pulse having the edge time.

In other embodiments a method of generating a pulse width modulated signal from a sampled input signal consistent with certain embodiments of the present invention involves applying a reference clock signal to a tapped delay line to generate a plurality of time delayed reference clock transitions having finer time resolution than the reference clock signal; calculating a delay line tap address associated with a rising edge time of the sampled input signal; addressing the delay line tap address associated with the rising edge to produce a rising edge time; generating a rising edge of an output pulse at the rising edge time; calculating a delay line tap address associated with a falling edge time of the sampled input signal; addressing the delay line tap address associated with the falling edge to produce a falling edge time; and generating a falling edge of an output pulse at the falling edge time.

It will be apparent, upon consideration of the present discussion, that the present process can be easily modified to select one or both of the rising and falling edges in a symmetrical or independent manner as desired to produce any of the four types of PWM described earlier.

If a reference clock rate $F_{REF}$ is appropriately selected so that its ratio to the sampling rate $F_{sample}$ is related as a power of two, a simplified hardware architecture can be devised to carry out the basic computations described above. Such is the case in an exemplary circuit depicted as DPWM 500 of FIG. 7. In this case, $2F_{sample}/F_{REF}=k=2_{-Y}$ and the input signal is normalized to a value between 0 and 1. Consider for example, a high fidelity audio system that conforms to compact disc (CD) standards. Requirements for a digital audio amplifier begin with the CD standard of 16 bits of resolution and a sampling rate ($F_{sample}$) of 44.1 KHz. The time step resolution then becomes $t_d=((1/F_{sample})/2^{16})=346$ psec. Extending this to 192 KHz would result in $t_d =79.5$ psec. To achieve this exemplary specification, a two-state PWM signal with a sampling rate of 192 KHz should have a signal rise and fall defined with a resolution of ±39.75 psec to provide a SNR of 90 dB equivalent to a-digital signal with,16 bits of definition.

This value of $t_d$ at 79.5 psec can be implemented with a 32 tap delay line with delay buffers, each having a delay of $t_d$ for use in constructing the delay line and MUX circuit 504 (having structure similar to that described previously, for example). Using conventional technology, a counter architecture with a speed of 79.5 psec, would need to operate at a clock frequency of 12.6 GHz. Of the two options the delay buffer at 79.5 psec is practical while a clock speed of 12.6 GHz is not currently possible (e.g., in 0.13 um CMOS technology), and may be challenging and current consuming for the foreseeable future. Although, a reference clock signal is still needed with the use of a delay line architecture, the clock speed can be reduced by a factor equal to the number of delay buffers (N), serial connected in the delay line. Selecting N equal to a power of 2 such as 32 or $2^5$, reduces the clock speed to 393.2 MHz, a much more practical value that will result in much simpler implementation and lower current drain. So, for this embodiment, the total time delay through all N buffers (with N=32) is equal to one cycle of the input clock $F_{REF}$ at 393.2 MHz.

For ideal power switching signal properties the PWM would span the range of duty cycle from zero to 100%. However, practical switching would have a non-ideal edge shape, reducing the maximum duty cycle that can be obtained in practice somewhat (for example assume approximately 95% for this exemplary design). To account for this, the reference clock speed can be increased by the inverse of the maximum duty cycle or 1.0526 for this 95% example. The 393.2 MHz clock speed would then increase to a value of 413.9 MHz. Of course, there is some flexibility in selecting the reference frequency $F_{REF}$ to a larger and potentially more convenient value if desired or needed.

For this example system, a 32:1 MUX is used to select one of the 32 taps of the delay line forming part of delay line and MUX circuit 504. A five-bit MUX input is provided due to the selected ratio of $1/F_{REF}$ to $t_d$ being selected as $32 = 2^5$. The digitized input signal is normalized to a value between 0 and 1 and provided to an array of D Flip Flops 508 that are clocked at the sampling rate $F_{sample}$ by the falling edge of the overflow from summer 534 (assuming 0% and 100% duty cycle is not allowed in the output PWM signal). The output of the D flip flop array is provided to an array of multiplexers 512 which operates under control of a control signal 516 that signals the center of a pulse. Each time the control signal is received, multiplexer array 512 switches from receiving K_rise to receiving K_fall so that each signal is received alternately. The input signal is thus applied directly to the multiplexer 512 as an indication of the rising edge (K_rise) and the multiplexer 512 is switched at the center of the pulse to switch to the falling edge (K_fall) by subtracting the input signal from 1 at adder 520. This provides a summer circuit 534 with two input signals $K_0$ and $C_j$ that represent values of the input signal associated with a sample and translated to alternating rising and falling edge values as a fraction of the delay line length.

Figure 8:
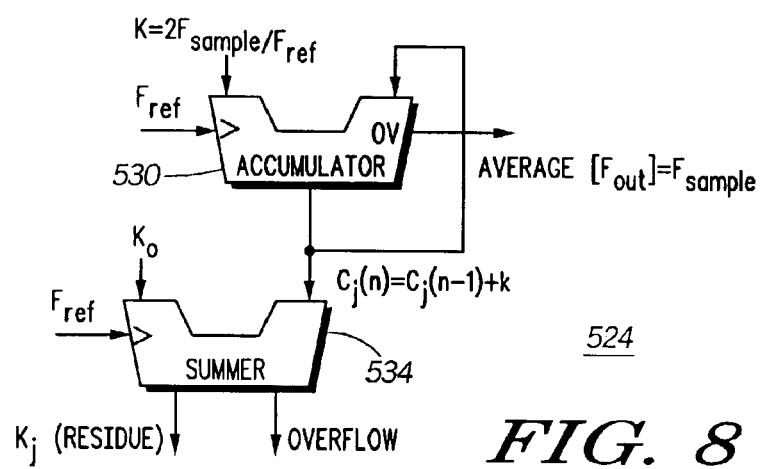
FIG. 8 is a detail of the accumulator circuits used in a hardware implementation consistent with certain embodiments of the present invention.

The operation of summer circuit 534 can be better understood by reference to FIG. 8. Recall that pulse-width-modulation is the representation of a signal sample value S(t) with the duty cycle of a two-state signal or its DC value. The pulse width can begin at, end at, or be centered about the sampling signal timing marker. These correspond to falling edge, rising edge, or two-sided about the sampling marker pulse width modulation. To implement the more complex centered method, an accumulator 530 can be used with its input value k determined in accordance with certain embodiments with the following relation:

$$0 \leq k = \frac{2F_{sample}}{F_{REF}} \leq 1 \qquad \text{Equation 1}$$

where the value k represents the fractional portion of a sampling signal period during one cycle of $F_{REF}$. (In other embodiments, with suitable modification of the action of the summer 534, the value of k can be given $F_{sample}/F_{REF}$ without departing from the invention.) Over a number of $F_{REF}$ periods, the accumulator digital output $C_j$ increments by the value of k until an overflow signal occurs every $2F_{sample}$. This value of the residue $C_j$ also contributes to causing an overflow to occur in the summer 534 every $2F_{sample}$.

Two overflow signals indicate a complete period of the sampling signal $F_{sample}$. The ratio of the pulse width with respect to the sampling period is directly proportional to the ratio between the input signal and the peak amplitude. When the maximum input signal amplitude is normalized to one, the audio input value is automatically translated into phase information $K_0$ which forms the input of a summer 534. This phase information summed with the accumulator digital output $C_j$ produces an overflow and a residue at the rate of two times the sampling frequency, so that two values—one for a rising edge and one for a falling edge—can be captured at the residue of summer 534. This overflow output is also used as the sample signal marker associated with $F_{sample}$, signal, indicating the correct time to produce an output pulse edge (two per sample). The residue $K_j$ represents the fractional part of the reference clock frequency, where $0<K_j<k$. Thus, the output of summer 534 establishes the rising and falling times for the edges of the PWM signal. This residue value can be fed into the MUX forming part of delay line and MUX circuit 504 to achieve finer time resolution by selecting one of the thirty-two taps (or in general N taps) of the digital delay line. Since the 32-stage digital delay line holds one wavelength of the frequency clock, the time resolution of the delay line output is $1/(32*F_{REF})$. The accumulator 530 and summer 534 operate within a set of normalized boundaries between 0 and a maximum value. This normalized range is later denormalized in the divider 542.

Thus, referring back to FIG. 7, the residue output of summer 534 is supplied as an input to a latch 538 and is latched into latch 538 using the positive edge of the overflow pulse from summer 534 as a clock. A summer overflow indicates to the latch 538 that it is time to latch in a value of $K_j$ representing either a rising or a falling edge that should be created to produce the output PWM signal. This value of $K_j$ can then be divided by k at block 542 and used to directly address the appropriate tap from the delay line. Since frequencies were selected with the relationship of $k=2^{-Y}$, shifting the value of $K_j$ to the left by Y bits easily provides the divide function at high speed at element 542, which is driven by the same positive edge of the overflow pulse 558 from 534 as a clock signal at frequency $2F_{sample}$. Thus, divider 542 denormalizes the accumulator 530 and summer 534 outputs by converting their relationship back to the relative values associated with $F_{REF}$ and $F_{sample}$.

As a result of the above, a fractional value between adjacent pulses of $F_{REF}$ is selected as a delay out signal which is applied to a switch 546 operating using control signal 516 to switch its output to either the Set or Reset inputs of an S/R flip flop 550 to alternately produce rising and falling edges to form the PWM output. In this instance, blocks 546 and 550 serve the function of pulse edge generator 318 as depicted in FIG. 5. While not explicitly shown, signal processing such as dithering or filtering could also be carried out in this embodiment by appropriate processing of the tap address and tap selection times with a signal processor. Such variations and others are contemplated. For example, in order to further reduce power consumption of the above circuit, the DLL signal can be applied only when an output signal is expected at a tap.

Since the ratio between the reference clock frequency and the signal sample frequency is two to the power of Y, the dividing operation can be easily replaced by shifting $K_j$ to the left Y times and then taking the most significant 5 bits (in this example) for the MUX input. This scheme dramatically decreases the complexity of the circuits. A rising and falling edge time interpolated set of signals are applied to the set and reset terminals of an RS flip flop. Where the flip flop output Q is a Class AD two-state digital pulse width modulated signal. Rescaled input signal terms will provide two-state Q output coupled with the input signal most-significant-bit into a Class BD three-state signal across the load terminals of a bridge network.

Figure 7:
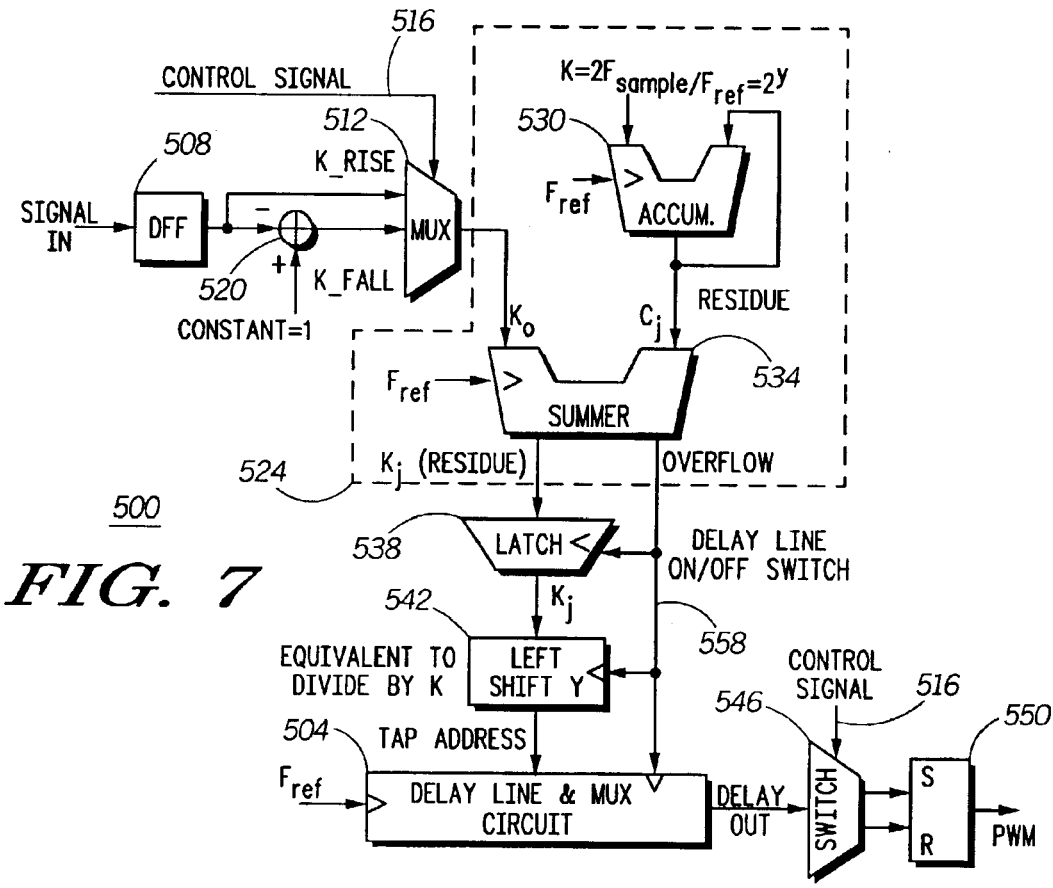
FIG. 7 is a hardware implementation of a DPWM circuit consistent with certain embodiments of the present invention.

Two sided pulse width modulation is applied as an input to the system of FIG. 7 with a summer. The input signals to the summers are $C_j$ and the modulation signal $S_R$ (rising) and $S_F$ (falling). These modulation values can be symmetric about the sampling marker or asymmetric, representing a factor of two sampling rate increase. Since the rising and falling edge signals ($S_R$ and $S_F$), are never expected to occur during the same reference signal $F_{REF}$ period, a single summer and divider can be shared between $S_R$ and $S_F$.

As mentioned previously, there are two digital Class D signal processing methods, Class AD or BD, where AD is a two-state digital signal, while BD is a tri-state digital signal. Although often considered more complex, the Class BD method has a number of signal performance advantages, such as flexible bridge driver switching, spurious reduction, and power amplifier conversion efficiency, which are often considered important to battery powered applications. Both methods can be implemented with the architecture shown in FIG. 7 by modifying the digital Signal In. For Class BD the bits of the digital Signal In would be rotated to the left with the most significant bit (MSB) becoming the SGN (zero or one), and a don't care bit is loaded into the least significant bit (LSB) position. What results is a digital rectification of the input signal with the SGN bit isolated out of the pulse-width-modulation algorithm. If the number of digital interface bits is a fixed power of 2, the MSB or the SGN can be rotated into the LSB position and defined as the SGN.

Figure 9:
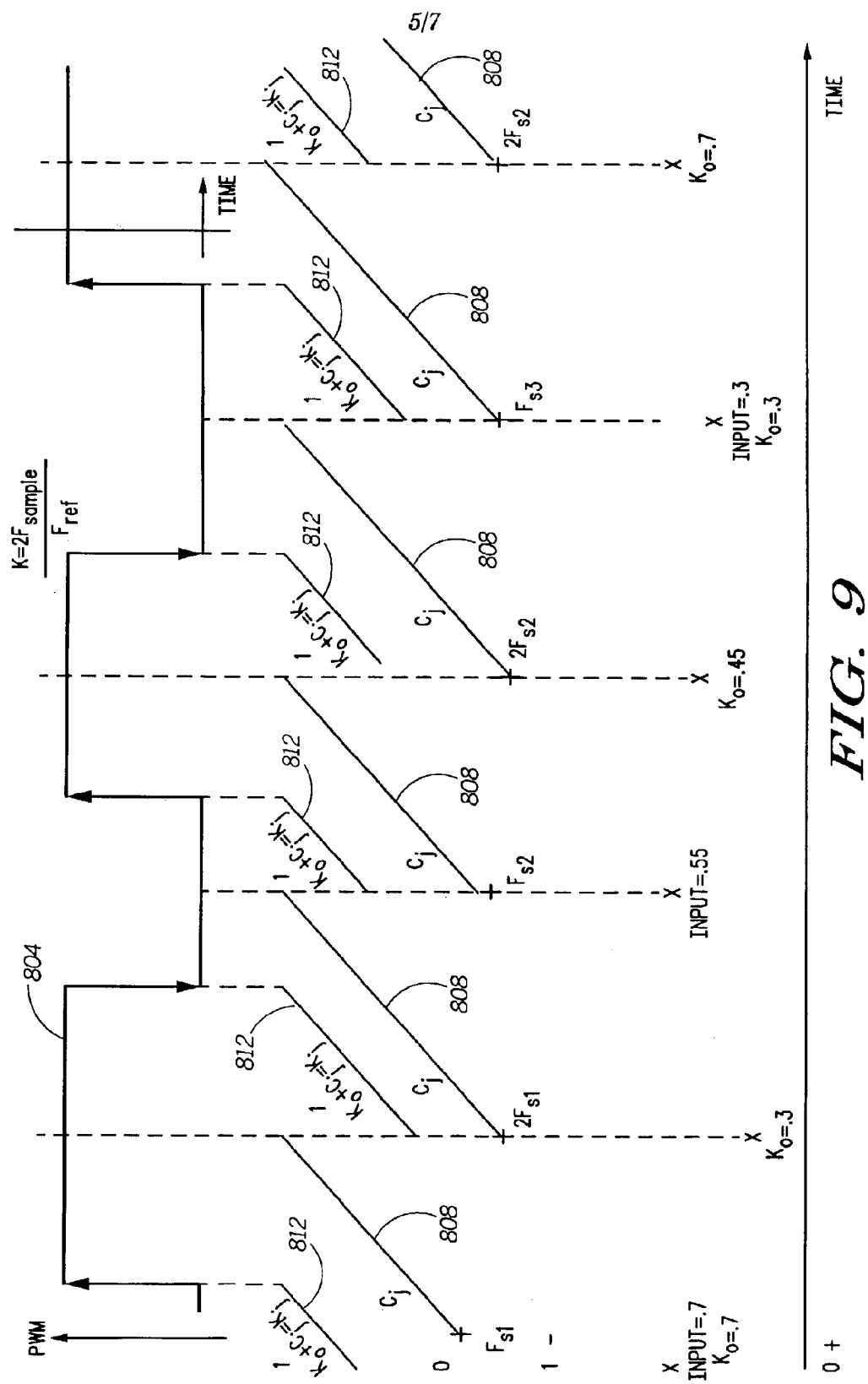
FIG. 9 is a graph showing several of the signals in the diagram of FIG. 8 if $k=2F_{sample}/F_{REF}$ to illustrate operation of certain embodiments consistent with the present invention.

The operation of the circuit arrangement of FIG. 7 may be best understood by reference to the graph depicted in FIG. 9. In this graph, the top curve 804 represents an output PWM signal from flip flop 550. Curves 808 represent the residue output $C_j$ of accumulator 530. Curves 812 represent the residue output of $K_j$ of summer 534. When the output of accumulator 530 reaches 1 (representing the maximum count of the accumulator), an overflow occurs. Similarly, when curve 812 reaches 1 (representing the upper limit of the summer 534), summer 534 overflows. The point of overflow of summer 534, corresponds to an upward or downward transition of the output PWM signal curve 804, since the overflow output triggers selection of a delay line tap and production of an output rising or falling edge. The points shown on the lower curve represent exemplary input values and their corresponding values of $K_0$ at the output of multiplexer 512 (represented as analog values for ease of understanding). For this example, input signals are normalized to values between 0 and 1, and the value of k is set to be $2F_{sample}/F_{REF}$.

When the sum of $K_0$ and $C_j$ reach the maximum value allowed by the summer, an overflow occurs and either a rising or a falling edge is produced. Overflows of accumulator 530 occur approximately at the center of the output PWM pulses as well as in between pulses.

Figure 10:
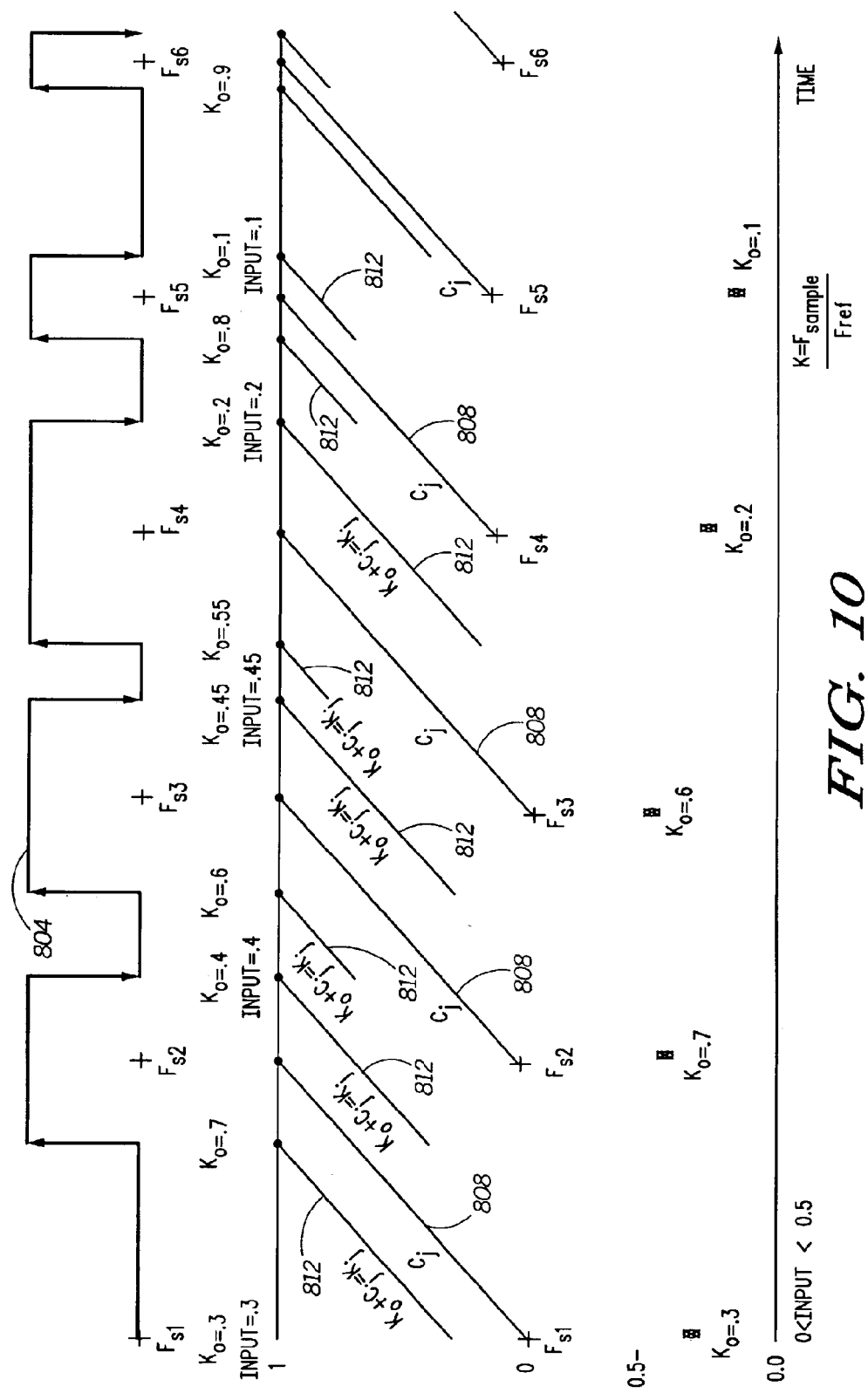
FIG. 10 is a graph showing several of the signals in the diagram of FIG. 8 if $k=F_{sample}/F_{REF}$ to illustrate operation of certain embodiments consistent with the present invention.

The value of k may also be set to be $F_{sample}/F_{REF}$, i.e., $k=L*F_{sample}/F_{REF}$ where L=1 or 2—in this case 1. In such an embodiment, the input signal is normalized to between 0 and 0.5 and the operation is illustrated in the graph of FIG. 10. In this graph, the top curve 804 again represents an output PWM signal from flip flop 550. Curves 808 again represent the residue output $C_j$ of accumulator 530. Curves 812 again represent the residue output of $K_j$ of summer 534. When the output of accumulator 530 reaches 1 (representing the maximum count of the accumulator), an overflow occurs. Similarly, when curve 812 reaches 1 (representing the upper limit of the summer 534), summer 534 overflows. The point of overflow of summer 534, again corresponds to an upward or downward transition of the output PWM signal curve 804, since the overflow output triggers selection of a delay line tap and production of an output rising or falling edge. The points shown on the lower curve represent exemplary input values and their corresponding values of $K_0$ at the output of multiplexer 512 (represented as analog values for ease of understanding).

When the sum of $K_0$ and $C_j$ reach the maximum value allowed by the summer, an overflow occurs and either a rising or a falling edge is produced. Overflows of accumulator 530 occur approximately at the center of the output PWM pulses.

Thus, an exemplary digital pulse width modulator consistent with certain embodiments of the present invention has a reference clock that produces a clock signal at frequency $F_{REF}$. A tapped delay line receives the reference clock and generates a plurality of time delayed reference clock transitions having finer time resolution than the reference clock signal. A multiplexer receives the plurality of time delayed reference clock transitions as an input thereto and produces an output when one of the plurality of time delayed reference clock transitions is addressed. An input circuit receives a sampled input signal at a sampling rate $F_{sample}$, the sampled input signal being normalized to a maximum value X, and generates sample values $K_0$ for each sample thereof, where $K_0$ equals one of the sample value and X—the sample value. An accumulator accumulates values of k, where $k=L*F_{sample}/F_{REF}$, where L=1 or 2, and produces an output residue $C_j$. A summer receives $C_j$ from the accumulator and adds $C_j$ to $K_0$, to produce a residue and an overflow, where a summer overflow establishes a selection time for selection of a delay line tap, and where the summer residue is a representation of the tap address of the delay line to be selected at the selection time. A tap selection circuit receives the summer overflow and summer residue and addresses a tap of the delay line. A pulse edge generator receives the addressed tap from the delay line and generates an edge of an output pulse therefrom.

Figure 11:
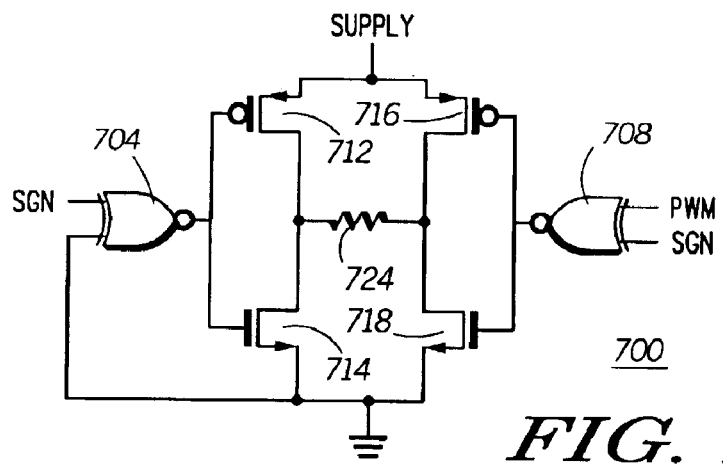
FIGS. 11–13 are schematics of bridge circuits suitable for implementing class BD operation of the DPWM consistent with certain embodiments of the present invention.

A bridge circuit such as that illustrated as 700 in FIG. 11 can be used to apply Class BD modulated signal across the terminals of load 724. This SGN signal is applied to one input of each of Exclusive NOR gates 704 and 708 and serves to swap signals $S_R$ and $S_F$ when its value is zero. The other input of gate 704 is connected to ground while the second input of gate 708 serves as a two state input for a class AD signal PWM. The output of the Exclusive NOR gates each drive a complimentary pair of transistors 712 and 714, and 716 and 718 respectively, which in turn differentially drive a resistor load 724. What results is a three state output signal across the load resistor 704 defined as, positive-to-negative, zero, and negative-to-positive. A two state Class AD signal applied to the load 724, would not have the zero voltage state across the load terminals. There are two addition Class BD driver networks shown in FIG. 12 and FIG. 13. These circuits can be used to provide balanced circuit loading conditions across the bridge network of devices 712, 714, 716, and 718. Although the load is defined as a resistance it can be complex with inductive or capacitive reactance in addition to real resistive component.

Figure 12:
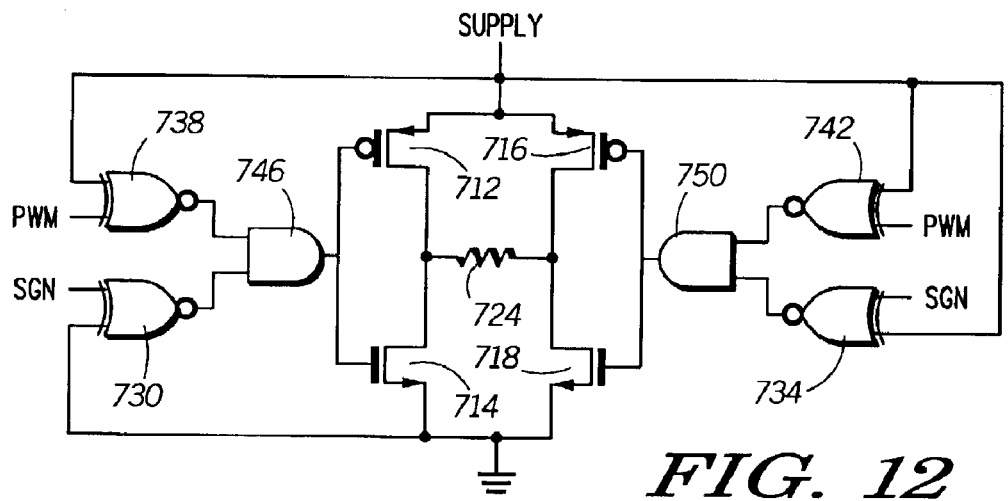
Figure 13:
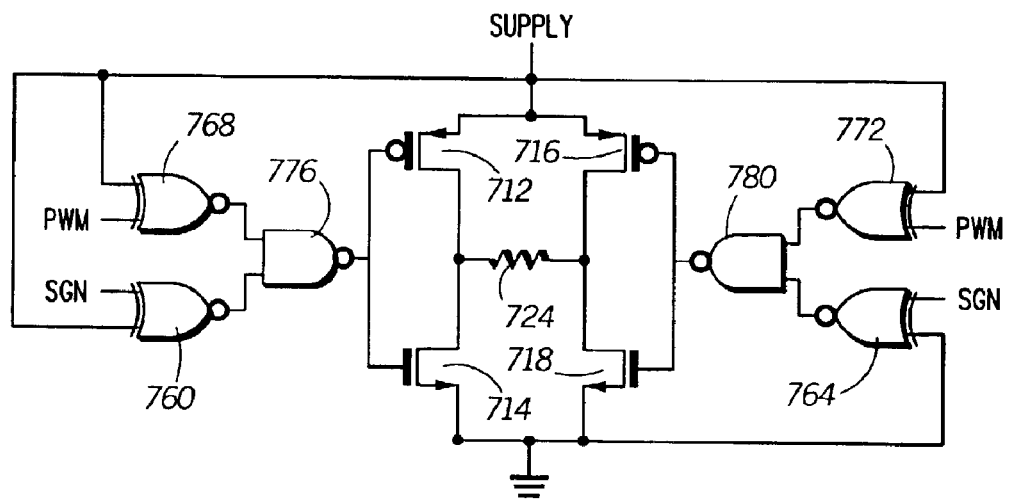

The circuit of FIG. 12 produces the third state by placing both terminals of the load to supply (or near supply), while the circuit of FIG. 13 produces the third state by placing both terminals of the load to ground (or near ground). The circuit of FIG. 11 can operate by either placing both terminals at ground or supply. Another case can be envisioned in which both terminals are place in a high impedance state.

In FIG. 12, the SGN signal is applied to an input of Exclusive NOR gates 730 and 734 while the other input is connected to ground and supply respectively. The PWM signal is applied to one input of Exclusive NOR gates 738 and 742 while the other inputs of Exclusive NOR gates 738 and 742 are connected to supply. The outputs of Exclusive NOR gates 730 and 738 form inputs for a two input AND gate 746 while the outputs of gates 734 and 742 form inputs for AND gate 750. The output of AND gate 750 drives the gates of transistors 716 and 718, while the output of AND gate 746 drives the gates of transistors 712 and 714. Transistors 712, 714, 716 and 718 drive load 724 in the same manner as in FIG. 11.

In FIG. 13, the SGN signal is applied to an input of Exclusive NOR gates 760 and 764 while the other input is connected to supply and ground respectively. The PWM signal is applied to one input of Exclusive NOR gates 768 and 772 while the other inputs of Exclusive NOR gates 768 and 772 are connected to supply. The outputs of Exclusive NOR gates 760 and 768 form inputs for a two input NAND gate 776 while the outputs of gates 764 and 772 form inputs for NAND gate 780. The output of NAND gate 780 drives the gates of transistors 716 and 718, while the output of NAND gate 776 drives the gates of transistors 712 and 714. Transistors 712, 714, 716 and 718 drive load 724 in the same manner as in FIG. 11 and FIG. 12.

Thus, in this exemplary embodiment, a method for direct digital pulse width modulation (DDPWM) generation is introduced with very fine time step resolution. Simulation results for a design using 0.13 um CMOS DPWM with two-sided modulation about the sample signal timing markers for Class BD audio power amplifier application and using 44.1 or 192 KHz sampling rate with a PWM resolution of 79 psec achieved the desired signal-to-noise ratio (SNR) of 90 dB. This SNR was achieved without the use of over sampling or noise shaping. The disclosed architecture allows programmable over sampling ratio and adjustable resolution. The frequency synthesis and the pulse width modulation can be combined into a single algorithm in the current structure. Thus, the DPWM architecture presented herein reduces the need for noise shaping and oversampling to achieve 90 dBc SNR. This results is a lower cost and lower power consumption associated with digital audio processing. This delay line accumulator architecture also provides a flexible gear-shifting digital interface. Sampling frequency, PWM value (K0), and PWM method can all be programmed on a sampling cycle-by-cycle basis, thus enabling additional digital signal processing opportunities such as linearization of the non-linear compression function associated with the bridge finals used to drive the amplifier load.

While the present invention has been described in terms of an embodiment that selects both the rising and falling edges to create an output PWM signal, as previously described other forms of PWM may only vary the rising or falling edge. By creation or utilization of an overflow signal in summer 534 for only the rising or falling edge respectively, these alternative embodiments of PWM are readily realized without departing from the present invention.

Those skilled in the art will recognize that the present invention has been described in terms of exemplary embodiments based upon use of a programmed processor such as processor 308. However, the invention should not be so limited, since the present invention could be implemented using hardware component equivalents, e.g., as depicted in FIG. 5 or other special purpose hardware and/or dedicated processors which are equivalents to the invention as described and claimed. Similarly, general purpose computers, microprocessor based computers, microcontrollers, optical computers, analog computers, dedicated processors and/or dedicated hard wired logic may be used to construct alternative equivalent embodiments of the present invention.

Those skilled in the art will appreciate that the program steps and associated data used to implement the embodiments described above can be implemented using any suitable computer readable storage medium such as for example disc storage, Read Only Memory (ROM) devices, Random Access Memory (RAM) devices, semiconductor storage elements, optical storage elements, magnetic storage elements, magneto-optical storage elements, flash memory, core memory and/or other equivalent storage technologies without departing from the present invention. Such alternative storage devices should be considered equivalents.

The present invention, as described in certain embodiments herein, is implemented using a programmed processor executing programming instructions that are broadly described above in flow chart form that can be stored on any suitable computer readable storage medium (e.g., disc storage, optical storage, semiconductor storage, etc.) or transmitted over any suitable electronic communication medium. However, those skilled in the art will appreciate that the processes described above can be implemented in any number of variations and in many suitable programming languages without departing from the present invention. For example, the order of certain operations carried out can often be varied, additional operations can be added or operations can be deleted without departing from the invention. Error trapping can be added and/or enhanced and variations can be made in user interface and information presentation without departing from the present invention. Such variations are contemplated and considered equivalent.

While the invention has been described in conjunction with specific embodiments, it is evident that many alternatives, modifications, permutations and variations will become apparent to those of ordinary skill in the art in light of the foregoing description. Accordingly, it is intended that the present invention embrace all such alternatives, modifications and variations as fall within the scope of the appended claims.

What is claimed is:

1. A method of generating a pulse width modulated signal from a sampled input signal, comprising:

applying a reference clock signal to a tapped delay line to generate a plurality of time delayed reference clock transitions having finer time resolution than the reference clock signal;

calculating a delay line tap address associated with an edge time of the sampled input signal, wherein the calculating of the delay line tap addresses is carried out in an accumulator and summer circuit which generates a tap address that represents at least one of a rising and a falling edge time of an output pulse width modulated signal;

addressing the delay line tap address associated with the edge time to produce a pulse edge at the edge time; and generating a pulse having the edge time.

2. The method according to claim 1, wherein the generating comprises generating a pulse forming one of a two state and a three state output.

3. The method according to claim 1, wherein the edge comprises a rising edge.

4. The method according to claim 3, further comprising:

calculating a delay line tap address associated with a falling edge time of the sampled input signal;

addressing the delay line tap address associated with the falling edge to produce a pulse edge at the falling edge time; and generating a falling edge of an output pulse at the falling edge time.

5. The method according to claim 1, wherein the edge comprises a falling edge.

6. The method according to claim 1, further comprising locking the tapped delay line in a delay locked loop.

7. A method of generating a pulse width modulated signal from a sampled input signal, comprising:

applying a reference clock signal to a tapped delay line to generate a plurality of time delayed reference clock transitions having finer time resolution than the reference clock signal;

calculating a delay line tap address associated with a rising edge time of the sampled input signal;

addressing the delay line tap address associated with the rising edge to produce a pulse edge at the rising edge time;

generating a rising edge of an output pulse at the rising edge time;

calculating a delay line tap address associated with a falling edge time of the sampled input signal;

addressing the delay line tap address associated with the falling edge to produce a pulse edge at the falling edge time;

generating a falling edge of an output pulse at the falling edge time, and wherein the calculating of the delay line tap addresses is carried out in an accumulator and summer circuit which generates tap addresses that represent rising and falling edge times of an output pulse width modulated signal.

8. The method according to claim 7, wherein generating the rising and falling edges comprise generating a pulse forming one of a two state and a three state output.

9. The method according to claim 7, further comprising locking the tapped delay line in a delay locked loop.

10. A pulse width modulator, comprising:

a reference clock;

a tapped delay line receiving the reference clock and generating a plurality of time delayed reference clock transitions having finer time resolution than the reference clock signal;

a multiplexer receiving the plurality of time delayed reference clock transitions as an input thereto and producing an output when one of the plurality of time delayed reference clock transitions is addressed;

a signal processing circuit that:

receives a sampled input signal;

calculates a delay line tap address associated with an edge time of the sampled input signal, wherein the signal processing circuit carries out the calculation of the delay line tap address in an accumulator and summer circuit which generates a tap address that represents at least one of a rising or falling edge time of an output pulse width modulated signal;

addresses the delay line tap address associated with the edge time to produce a pulse edge at the edge time; and a pulse edge generator that generates an edge of an output pulse at the edge time.

11. The pulse width modulator according to claim 10, wherein the generator generates an output pulse comprising one of a two state and a three state output pulse.

12. The pulse width modulator according to claim 10, wherein the signal processing circuit further carries out a process of at least one of noise shaping, dithering, filtering and predistortion.

13. The pulse width modulator according to claim 10, wherein the edge comprises a rising edge.

14. The pulse width modulator according to claim 10, wherein the signal processing circuit further:

calculates a delay line tap address associated with a falling edge time of the sampled input signal;

addresses the delay line tap address associated with the falling edge to produce a pulse edge at the falling edge time; and generates a falling edge of an output pulse at the falling edge time.

15. The pulse width modulator according to claim 10, wherein the edge comprises a falling edge.

16. The pulse width modulator according to claim 10, further comprising a delay locked loop that locks the tapped delay line.

17. A pulse width modulator, comprising:

a reference clock;

a tapped delay line receiving the reference clock and generating a plurality of time delayed reference clock transitions having finer time resolution than the reference clock signal;

a multiplexer receiving the plurality of time delayed reference clock transitions as an input thereto and producing an output when one of the plurality of time delayed reference clock transitions is addressed;

a signal processing circuit that:

receives a sampled input signal;

calculates a delay line tap address associated with a rising edge time of the sampled input signal;

addresses the delay line tap address associated with the rising edge to produce a pulse edge at the rising edge time;

calculates a delay line tap address associated with a falling edge time of the sampled input signal, wherein the signal processing circuit carries out the calculation of the delay line tap addresses in an accumulator and summer circuit which generates tap addresses that represents rising and falling edge times of an output pulse width modulated signal; and addresses the delay line tap address associated with the falling edge to produce a pulse edge at the falling edge time; and a pulse edge generator that generates a rising edge of an output pulse at the rising edge time and generates a falling edge of an output pulse at the falling edge time.

18. The pulse width modulator according to claim 17, wherein the pulse edge generator generates an output pulse comprising one of a two state and a three state output pulse.

19. The pulse width modulator according to claim 17, further comprising a delay locked loop that locks the tapped delay line.

20. A digital pulse width modulator, comprising:

a reference clock that produces a clock signal at frequency $F_{REF}$;

a tapped delay line receiving the reference clock and generating a plurality of time delayed reference clock transitions having finer time resolution than the reference clock signal;

a multiplexer receiving the plurality of time delayed reference clock transitions as an input thereto and producing an output when one of the plurality of time delayed reference clock transitions is addressed;

an input circuit that receives a sampled input signal at a sampling rate $F_{sample}$, the sampled input signal being normalized to a maximum value X, and generates sample values $K_0$ for each sample thereof, where $K_0$ equals one of the sample value and X—the sample value;

an accumulator that accumulates values of k, where $k=L*F_{sample}/F_{REF}$, where L=1 or 2, and produces an output residue $C_j$;

a summer that receives $C_j$ from the accumulator and adds $C_j$ to $K_0$, to produce a residue and an overflow, wherein a summer overflow establishes a selection time for selection of a delay line tap and wherein the summer residue comprises a representation of the tap address of the delay line to be selected at the selection time;

a tap selection circuit that receives the summer overflow and summer residue and addresses a tap of the delay line; and a pulse edge generator that receives the addressed tap from the delay line and generates an edge of an output pulse therefrom.

21. The digital pulse width modulator according to claim 20, wherein the generator generates an edge of an output pulse comprising one of a two state and a three state output pulse.

22. The digital pulse width modulator according to claim 20, wherein the tap selection circuit comprises a latch clocked by the overflow from the summer to store the residue from the summer; and an address calculation circuit that converts the summer residue to a tap address.

23. The digital pulse width modulator according to claim 20, wherein the address calculation circuit comprises a divider that divides the residue from the summer by k where $k=F_{REF}/L*F_{sample}$.

24. The digital pulse width modulator according to claim 23, wherein the divider comprises a binary left shift circuit.

25. The digital pulse width modulator according to claim 20, wherein the edge comprises a rising edge.

26. The digital pulse width modulator according to claim 20, wherein the edge comprises a falling edge.

27. The digital pulse width modulator according to claim 20, wherein the pulse edge generator generates both a rising and a falling edge of the output pulse.

28. The pulse width modulator according to claim 20, further comprising a delay locked loop that locks the tapped delay line.

29. The method according to claim 1, further comprising processing the input signal by a process of at least one of noise shaping, dithering, filtering and predistortion.

30. The method according to claim 7, further comprising processing the input signal by a process of at least one of noise shaping, dithering, filtering and predistortion.

31. The pulse width modulator according to claim 17, wherein the signal processing circuit further carries out a process of at least one of noise shaping, dithering, filtering and predistortion.

* * * * *